United States Patent
Kuo

(10) Patent No.: US 12,294,033 B2
(45) Date of Patent: May 6, 2025

(54) DEEP TRENCH CAPACITOR ARRAY WITH REDUCED WARPAGE

(71) Applicant: Taiwan Semiconductor Manufacturing Company, Ltd., Hsinchu (TW)

(72) Inventor: Fu-Chiang Kuo, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 625 days.

(21) Appl. No.: 17/709,314

(22) Filed: Mar. 30, 2022

(65) Prior Publication Data

US 2022/0367734 A1    Nov. 17, 2022

Related U.S. Application Data

(60) Provisional application No. 63/189,108, filed on May 15, 2021.

(51) Int. Cl.
| | |
|---|---|
| *H01L 29/94* | (2006.01) |
| *H01L 21/768* | (2006.01) |
| *H01L 23/48* | (2006.01) |
| *H01L 49/02* | (2006.01) |

(52) U.S. Cl.
CPC ...... *H01L 29/945* (2013.01); *H01L 21/76877* (2013.01); *H01L 21/76898* (2013.01); *H01L 23/481* (2013.01); *H01L 28/91* (2013.01)

(58) Field of Classification Search
None
See application file for complete search history.

(56) References Cited

U.S. PATENT DOCUMENTS

| | | | |
|---|---|---|---|
| 10,546,917 B1* | 1/2020 | Tsai | H01L 21/3083 |
| 2015/0333058 A1* | 11/2015 | Meiser | H01L 28/60 |
| | | | 438/387 |
| 2021/0202761 A1* | 7/2021 | Cheng | H01L 28/92 |
| 2022/0130949 A1* | 4/2022 | Huang | H01L 28/91 |
| 2023/0097616 A1* | 3/2023 | Huang | H01L 28/91 |
| | | | 257/534 |

\* cited by examiner

*Primary Examiner* — William C Trapanese
(74) *Attorney, Agent, or Firm* — KILPATRICK TOWNSEND & STOCKTON LLP

(57) ABSTRACT

A semiconductor die includes an array of first capacitor regions, each of the first capacitor regions including multiple first capacitor cell structures, wherein each first capacitor cell structure includes a plurality of first trench segments characterized by a first trench length, a first trench width, and a first trench spacing, and a first air gap width in a gap-filling material. The semiconductor die also includes a plurality of second capacitor regions interspersed in the array of first capacitor regions, each of the second capacitor region including multiple second capacitor cell structures, wherein each second capacitor cell structures includes a plurality of second trench segments characterized by a second trench length, a second trench width, a second trench spacing, and a second air gap width in the gap-filling material.

20 Claims, 14 Drawing Sheets

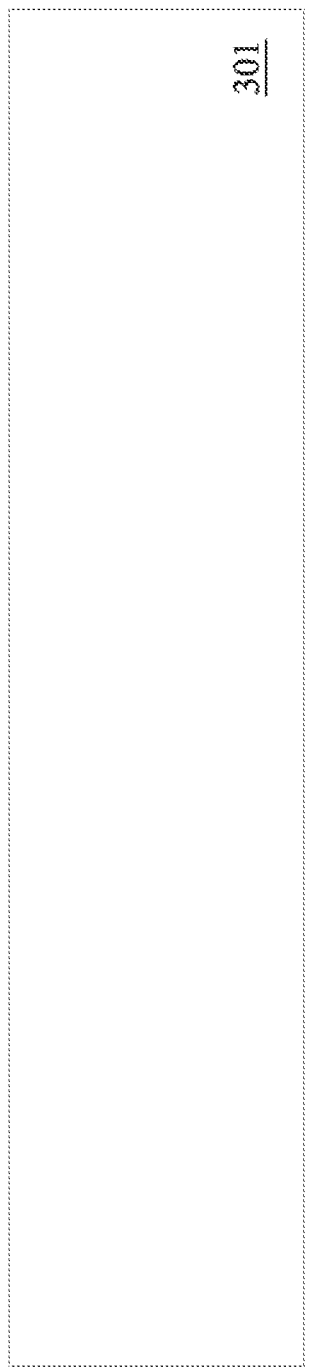

DEEP TRENCH CAPACITOR ARRAY WITH REDUCED WARPAGE

PRIORITY CLAIM AND CROSS-REFERENCE

The present application claims priority to U.S. Provisional Patent Application 63/189,108, filed on May 15, 2021, and entitled "NOVEL DUMMY PATTERN TO CAPACITY RELEASE WARPAGE," the entire disclosure of which is incorporated herein by reference.

BACKGROUND

In complex integrated circuit (IC) devices, there is often a need for large die capacitance structures. For example, the capacitance can include arrays of trench capacitors. With the increase in die size, these large die devices are more susceptible to stress and warpage, for example, due to thermal expansion in the fabrication process.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 7A-7G are simplified cross-sectional views illustrating a method for forming a semiconductor die, in accordance with some embodiments.

DETAILED DESCRIPTION

Figure 1:
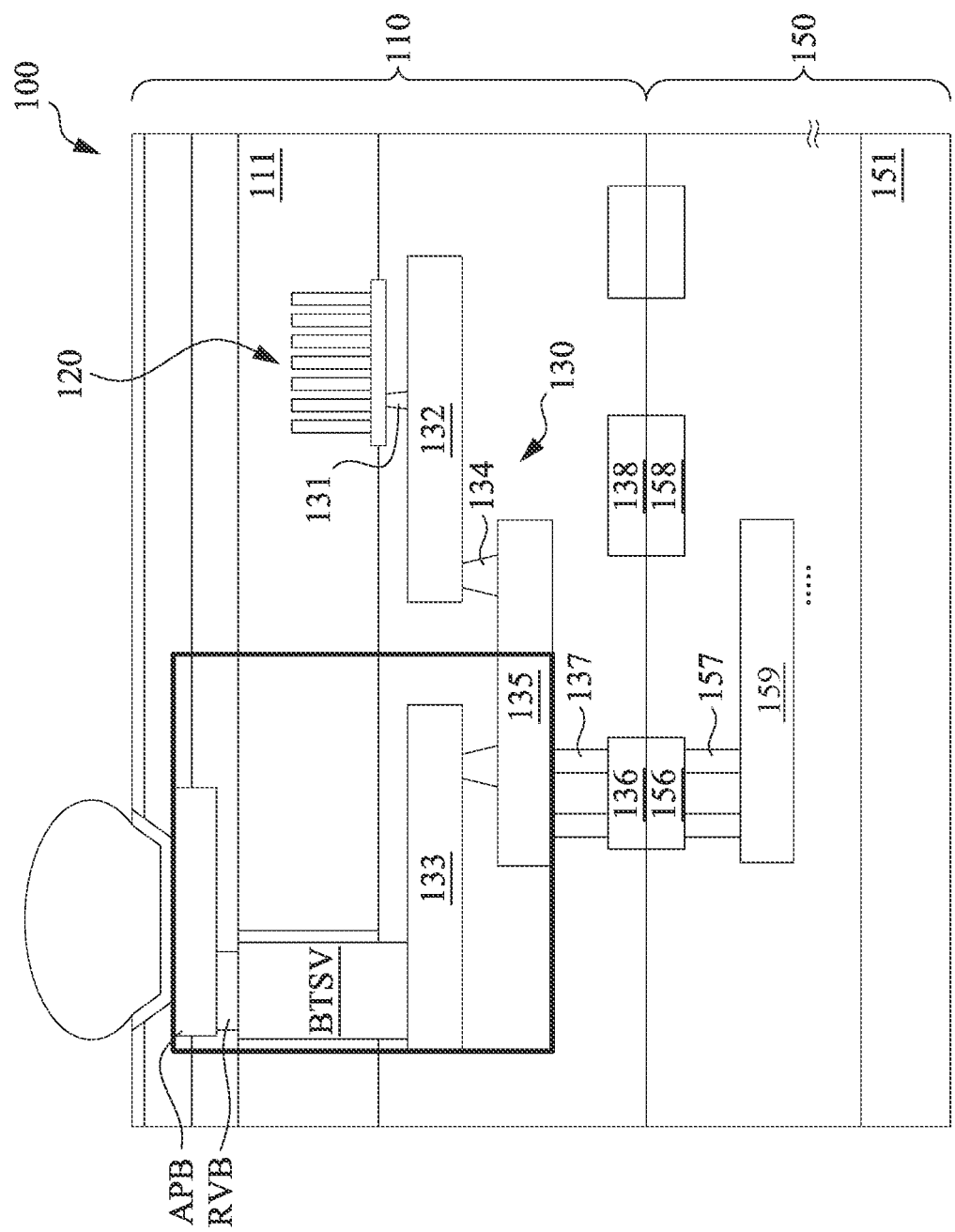
FIG. 1 is a simplified cross-sectional view illustrating a deep trench capacitor (DTC) die, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a simplified cross-sectional view illustrating a deep trench capacitor (DTC) die, in accordance with some embodiments. As shown in FIG. 1, semiconductor device 100 includes a semiconductor DTC die 110 and a second semiconductor die 150 bonded together. semiconductor DTC die 110 includes a capacitor portion 120 and an interconnect portion 130. Capacitor portion 120 is formed in a substrate 111 and can includes a plurality of trenches 121 formed in a substrate 111. Examples of the trench capacitor devices are described below. In the example of FIG. 1, the interconnect portion 130 includes a contact 131, first level metal interconnects 132 and 133, vias 134, and second level metal interconnect 135. Interconnect portion 130 also includes hybrid bond layer 136, hybrid bonding contact 137, and dummy hybrid bonding layer 138. The second semiconductor die 150 is bonded with semiconductor DTC die 110 by hybrid bonding. The second semiconductor die 150 includes devices built on a substrate 151 that make use of the capacitor structures in the semiconductor DTC die 110. Such devices can include memories, analog and mixed signal circuits, power control circuits, etc. The second semiconductor die 150 includes hybrid bond layer 156, hybrid bonding contact 157, and dummy hybrid bonding layer 158, and a top metal layer 159. Other device structures in the second semiconductor die 150 are omitted to simplify the drawings.

Figure 2:
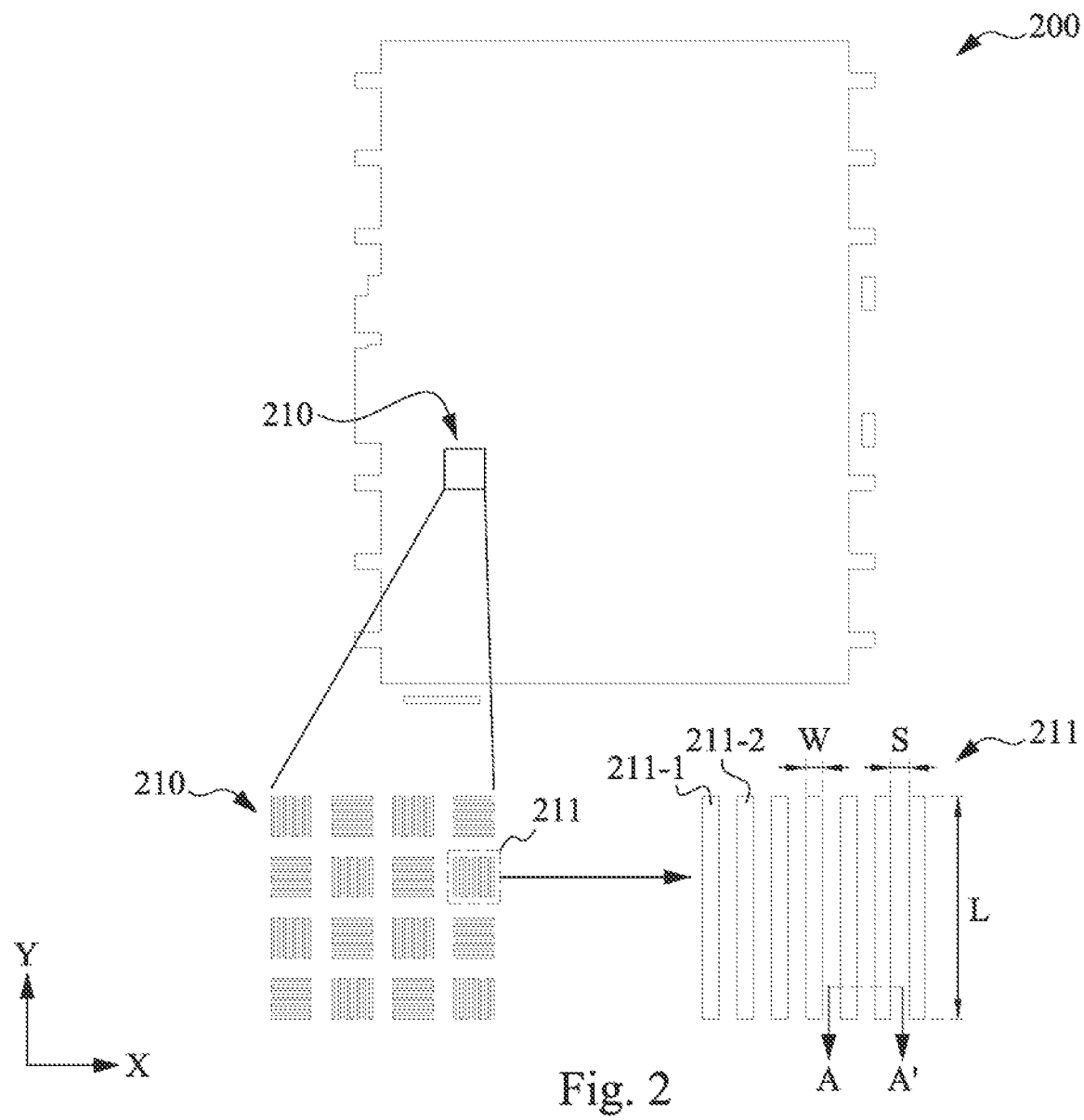
FIG. 2 is a simplified top view of the capacitor portion of the DTC die of FIG. 1, in accordance with some embodiments.

FIG. 2 is a simplified top view of the capacitor portion of the DTC die of FIG. 1, in accordance with some embodiments. FIG. 2 shows a top view of a trench capacitor array 200. A portion 210 of the trench capacitor array 200 is shown in a magnified view. FIG. 2 shows an array 200 of capacitor regions, e.g., region 210. Each of the capacitor regions, e.g., 210 includes multiple capacitor cell structures 211. Each first capacitor cell structure includes a plurality of trench segments 211-1, 211-2, . . . etc. In the example in FIG. 2, trench segment is a rectangular segment of trench formed in the substrate, and characterized by a trench length L, a trench width W, and a trench spacing S. However, other shapes and sizes of trenches can also be used in the capacitor cell structure.

The present disclosure thus provides various novel trench designs and layouts for high density trench capacitors that yield less warpage associated with the die and wafer. The inventors have observed that in a semiconductor die of deep trenches, a substantially uniform alignment of the capacitor arrays can increases stress between the capacitor structures. The stresses increase a likelihood of warpage and/or fracturing of the IC die as well as the wafer. Furthermore, as the capacitor structures are fully-filled with the conductive layers and dielectric layers, the stress is likely to increase. Therefore, in accordance with some embodiments, at least two different capacitor cell structures are intermingled to avoid uniform cell layouts.

Figure 3:
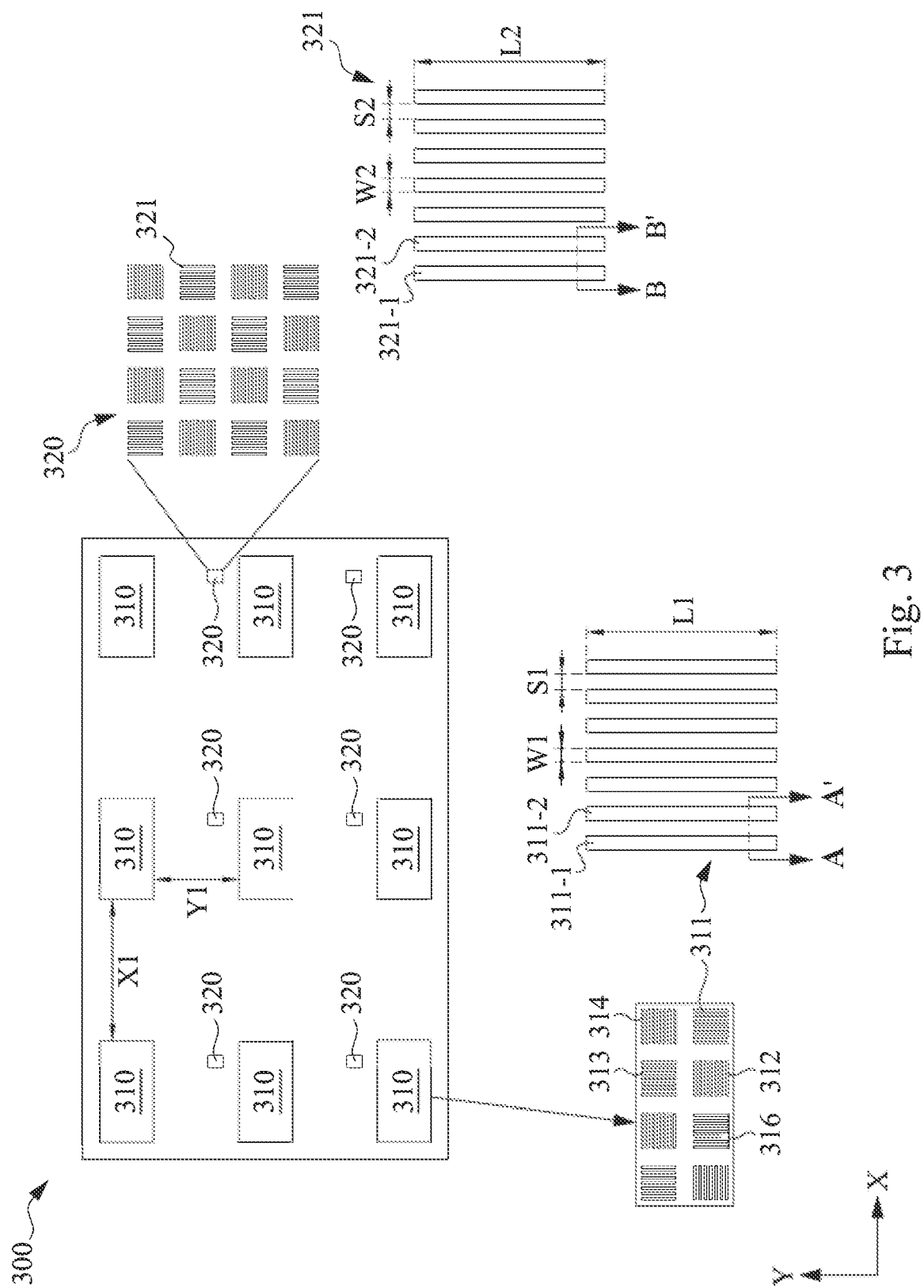
FIG. 3 is a simplified top view of a capacitor portion of a DTC die, in accordance with some embodiments.

FIG. 3 is a simplified top view of a capacitor portion of a DTC die, in accordance with some embodiments. As shown in FIG. 3, semiconductor die 300 including an array of first capacitor regions 310 and a plurality of second capacitor regions 320 interspersed in the array of first capacitor regions 310. Each of the first capacitor regions 310 includes multiple first capacitor cell structures 311. Each first capacitor cell structure 311 includes a plurality of first trench segments, e.g., 311-1, 311-2, ... etc., characterized by a first trench length L1, a first trench width W1, and a first trench spacing S1, and a first air gap width in a gap-filling material. Each of the second capacitor region 320 including multiple second capacitor cell structures 321, wherein each second capacitor cell structures 321 includes a plurality of second trench segments, e.g., 321-1, 321-2, ... etc., characterized by a second trench length L2, a second trench width W2, a second trench spacing S2, and a second air gap width in the gap-filling material. In some embodiments, the second trench width is greater than the first trench width, the second trench spacing is less than the first trench spacing, and the second air gap width is greater than the first air gap width by 20% or more.

In some embodiments, the first trench segments are characterized by a first trench length, and the second trench segments are characterized by a second trench length. In some embodiments, the second trench length is less than or equal to the first trench length.

As described above, the semiconductor die 300 in FIG. 3 includes an array of first capacitor regions, each of the first capacitor regions including multiple first capacitor cell structures and a plurality of second capacitor regions interspersed in the array of first capacitor regions, each of the second capacitor regions including multiple second capacitor cell structures. In some embodiments, each first capacitor region is configured to provide a capacitance between a first capacitor electrode and a second capacitor electrode connected to respective alternating electrode layers in the first capacitor cell structures. Each second capacitor region is configured to provide structural variation with different trench width, trench spacing, and air gap width from the first capacitor region, without capacitor electrodes for providing a capacitance. In this case, the second capacitor regions function as dummy regions. In some embodiments, however, the second capacitor regions can also be connected to capacitor electrodes to provide functioning capacitor devices. More details about the capacitor cell structures are described below with reference to the cross-sectional views along cut lines A-A' and B-B' of the capacitors in portions of FIG. 3.

Figure 4A:
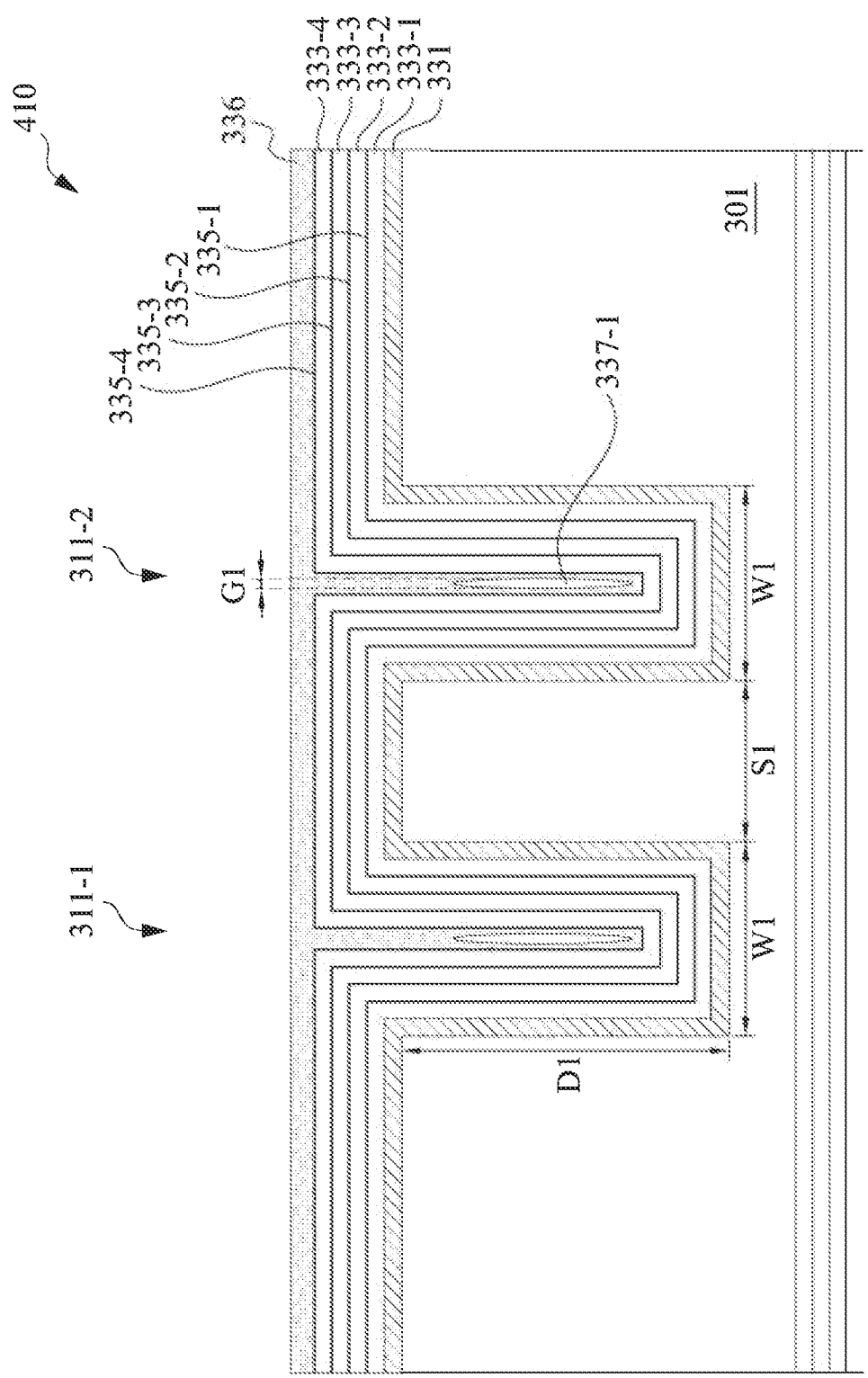
FIG. 4A and FIG. 4B are a simplified cross-sectional views along cut lines A-A' and B-B' of the capacitors in portions of FIG. 3. in accordance with some embodiments.
Figure 4B:
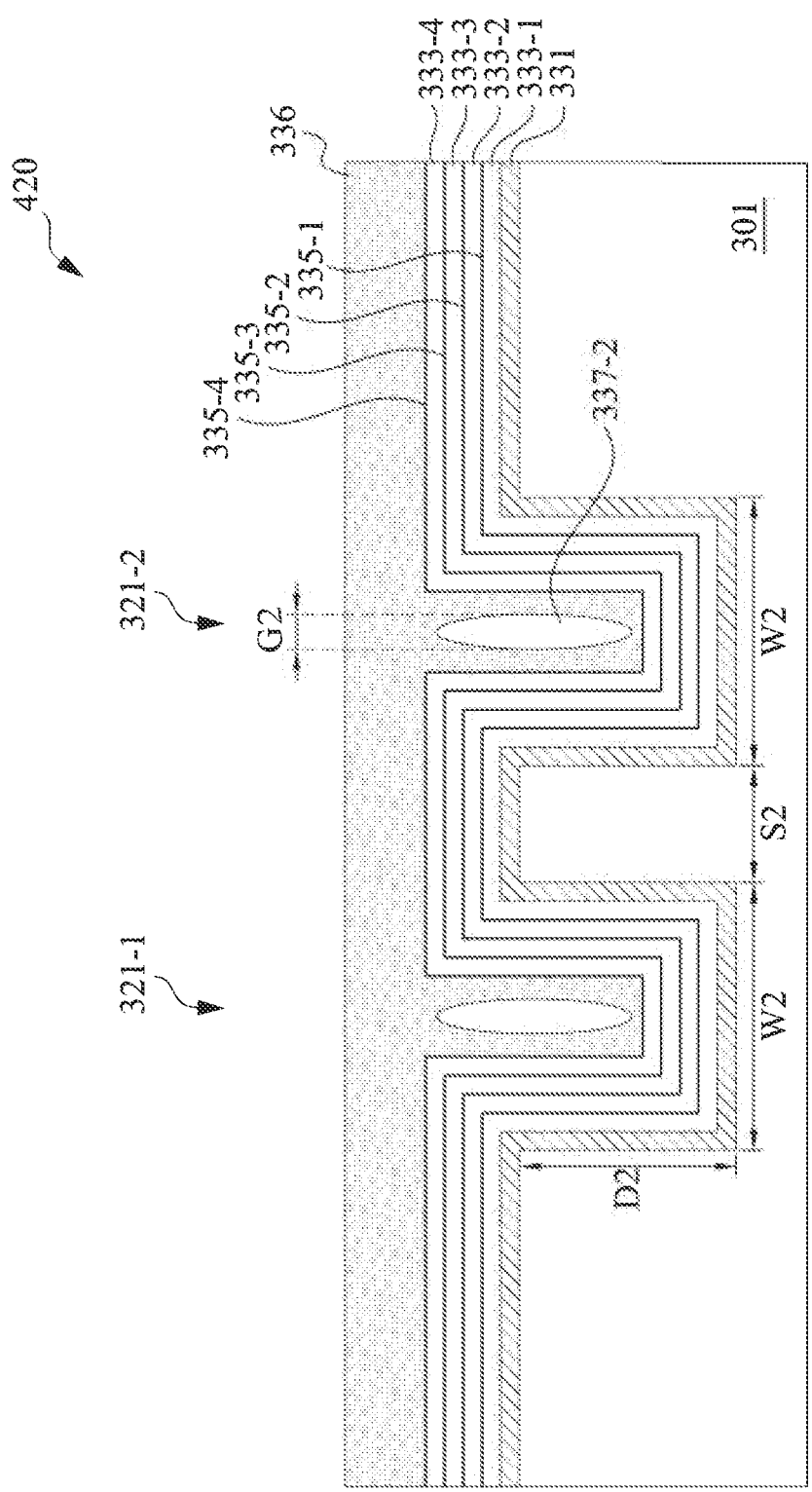

FIG. 4A and FIG. 4B are a simplified cross-sectional views along cut lines A-A' and B-B' of the capacitors in portions of FIG. 3, in accordance with some embodiments. In FIG. 4A, 410 shows a cross-sectional view along cut line A-A' of two trench segments 311-1 and 311-2 in the first capacitor cell structure 311 in FIG. 3. Besides trench width W1 and spacing S1, trench segments are also characterized by a first trench depth D1. In FIG. 4B, 420 shows a cross-sectional view along cut line B-B' of two trench segments 321-1 and 321-2 in the second capacitor cell structure 321 in FIG. 3. Besides trench width W2 and spacing S2, trench segments are also characterized by a second trench depth D2.

As shown in FIG. 4A, a liner layer 331 overlies the surface of trench segments 311-1 and 311-2, including the bottom sidewalls of the trench segments and the surface of the substrate. A stack of alternating electrode layers (333-1, 333-2, 333-3, and 333-4, etc.) and capacitor dielectric layers (335-1, 335-2, 335-3, and 335-4, etc.) overlie a bottom region and sidewalls of the given first trench segment 311-1 or 311-2. A gap-filling dielectric material 336 is deposited to fill a space in the given first trench segment not filled by the stack of alternating electrode layers and capacitor dielectric layers and leaving an air gap 337-1 of a first gap width G1 in the first trench segments 311-1 and 311-2.

As shown in FIG. 4B, a liner layer 331 overlies the surface of trench segments 321-1 and 321-2, including the bottom sidewalls of the trench segments and the surface of the substrate. A stack of alternating electrode layers (333-1, 333-2, 333-3, and 333-4, etc.) and capacitor dielectric layers (335-1, 335-2, 335-3, and 335-4, etc.) overlie a bottom region and sidewalls of the given second trench segment 321-1 or 321-2. A gap-filling dielectric material 336 is deposited to fill a space in the given second trench segment not filled by the stack of alternating electrode layers and capacitor dielectric layers and leaving an air gap 337-2 of a second gap width G2 in the second trench segments 321-1 and 321-2.

In some embodiments, the liner layer 331 is a dielectric material, for example a silicon oxide. However, the liner layer 331 can also be other suitable dielectric materials. In some embodiments, the thickness of the liner layer 331 can be between 10 nm to 60 nm, or other suitable thickness.

In some embodiments, the electrode layers (333-1, 333-2, 333-3, and 333-4, etc.) can include TiN, TaN, etc., or other suitable conductive materials. In some embodiments, the thickness of the electrode layers (333-1, 333-2, 333-3, and 333-4, etc.) can be in a range of 0.1 nm to 0.3 nm, or other suitable thickness. In some embodiments, the thickness of the electrode layers (333-1, 333-2, 333-3, and 333-4, etc.) can be in a range of 10 nm to 35 nm, or other suitable thickness.

In some embodiments, capacitor dielectric layers (335-1, 335-2, 335-3, and 335-4, etc.) can include high K dielectric materials, such as HfO, etc., or other suitable dielectric materials. In some embodiments, the thickness of the capacitor dielectric layers (335-1, 335-2, 335-3, and 335-4, etc.) can be in a range of 2 nm to 10 nm.

In some embodiments, the first trench width is in a range of 0.3 μm to 0.40 μm, and the second trench width is in a range of 0.25 μm to 0.35 μm. In some embodiments, the second trench width is greater than the first trench width by 10% or more.

In some embodiments, the first trench spacing is in a range of 0.1 μm to 0.20 μm, and the second trench spacing is in a range of 0.05 μm to 0.15 μm. In some embodiments, the second trench spacing is less than the first trench spacing by 20% or more.

In some embodiments, the gap-filling material 336 can be a dielectric material, such as silicon oxides, etc. The thinness of the gap-filling material 336 is selected to fill the gap in the trench segments. In some cases, the trench filling process leaves air gaps in the trench elements. The air gaps can help reduce warpage and breakage of the substrate. In some embodiments, the second air gap width is in a range of 100 nm to 500 nm, and the first air gap width is in a range of 0.2 nm to 50 nm. In some embodiments, the second air gap width is greater than the first air gap width by 50% or more. In some embodiments, the second air gap width is greater than the first air gap width by 200 nm to 300 nm.

In some embodiments, the first trench depth D1 is in a range of 3 um to 15 um. In some embodiments, the second trench depth D2 is in a range of 3 um to 15 um. In some embodiments, the second trench depth is less than or equal to the first trench depth.

Referring back to FIG. 3, a given first capacitor cell structure, for example, first capacitor cell structure 311 includes an array of first trench segments 311-1, 311-2, . . . etc., extending in a predetermined direction, for example, the y-direction.

In FIG. 3, a first capacitor region, for example, first capacitor region 310 includes a first array 311 of first trench segments extending in a first direction (the Y-direction), a second array 312 of first trench segments extending in a second direction (the X-direction) different from the first direction (the Y-direction), and a third array 313 of first trench segments extending in the first direction (the Y-direction).

In some embodiments, the first capacitor region comprises a two-dimensional array of first capacitor cell structures (311, 312, 313, and 314). Each first capacitor cell structure is oriented perpendicular to its immediate neighbors in the two-dimensional array. For example, first capacitor cell structure 311 is oriented perpendicular to its immediate neighbors first capacitor cell structures 312 and 314 in the two-dimensional array. Similarly, first capacitor cell structure 314 is oriented perpendicular to its immediate neighbors first capacitor cell structures 311 and 313 in the two-dimensional array. Further, first capacitor cell structure 312 is oriented perpendicular to its immediate neighbors first capacitor cell structures 311 and 313 in the two-dimensional array. The placement of the capacitor cell structures is configured to reduce regular repetitive structures that tend to increase warpage and breakage.

In some embodiments, a given the first capacitor region including multiple first capacitor cell structures. For example, in an embodiment, a first capacitor region can include four, eight, twelve, or sixteen, or other number of first capacitor cell structures, etc. In some embodiments, a first capacitor region can include four first capacitor cell structures forming a two-dimensional trench array. In some embodiments, the four first capacitor cell structures includes trench segments that are rotationally symmetric about a center of the two-dimensional trench array, and wherein each of the plurality of segments. In some embodiments, a first capacitor region can include multiple capacitor cells. As an example, a first capacitor region can include four, eight, twelve, or sixteen, etc., capacitor cells.

In some embodiments, the spacing between adjacent first capacitors cell structures in a first capacitor region is 1 µm to 5 µm. In some embodiments, the semiconductor die includes at least five first capacitor regions within 100 µm. In some embodiments, at least one first capacitor region is characterized by an aspect ratio greater than or equal to 5.

In some embodiments, the regularity of the capacitor cell structure placement can be further varied by including a second capacitor cell structure in an array of first capacitor structures, for example, in array 310 of first capacitor cell structures, one of the capacitor cell structure, e.g., 316 can be replaced by a second capacitor cell structures.

In some embodiments, first capacitor regions 310 can be spaced apart by predetermined distances. For example, as shown in FIG. 3, a first capacitor regions 310 is spaced apart from its neighboring capacitor regions in the x-direction by a distance X1. Similarly, the first capacitor regions 310 is spaced apart from its neighboring capacitor regions in the y-direction by a distance Y1. In some embodiments, distance X1 can be between 30 to 70 mm, and distance Y1 can be between 10 to 60 mm.

Figure 5:
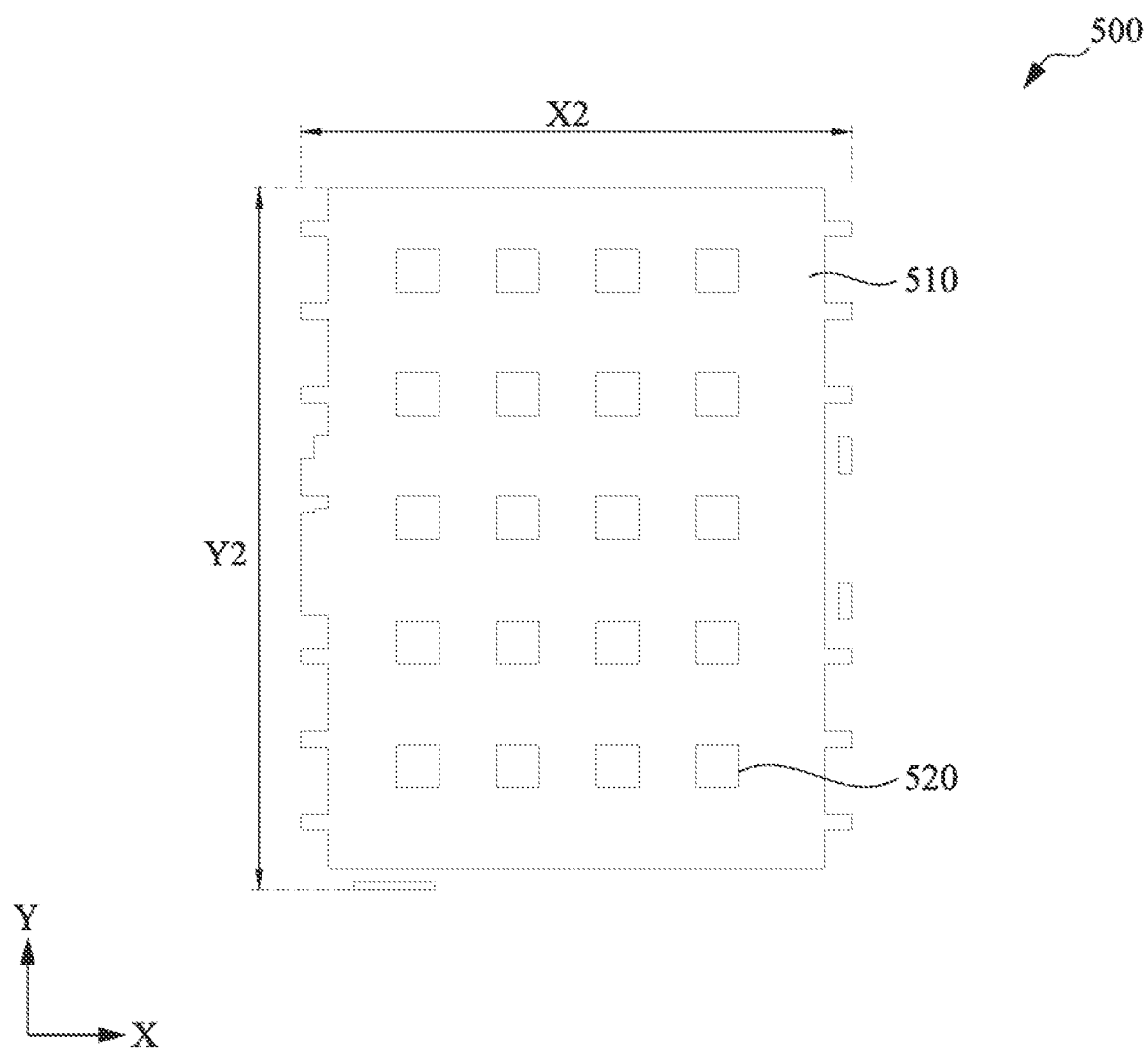
FIG. 5 is a simplified top view of a capacitor portion of another DTC die, in accordance with some embodiments.

FIG. 5 is a simplified top view of a capacitor portion of another DTC die, in accordance with some embodiments. As shown in FIG. 5, semiconductor die 500 including an array of first capacitor regions 510 and a plurality of second capacitor regions 520 interspersed in the array of first capacitor regions 510. In this example, the plurality of second capacitor regions 520 are arranged in a two-dimensional array, placed in a region of first capacitor regions 510 with a dimension of X2 by Y2. In some embodiments, X2 is in a range of 10 to 35 mm, and Y2 is in a range of 15 to 50 mm. Similar to described above in connection to FIG. 3, each of the first capacitor regions 510 includes multiple first capacitor cell structures, and each of the second capacitor regions 520 includes multiple second capacitor cell structures.

Figure 6:
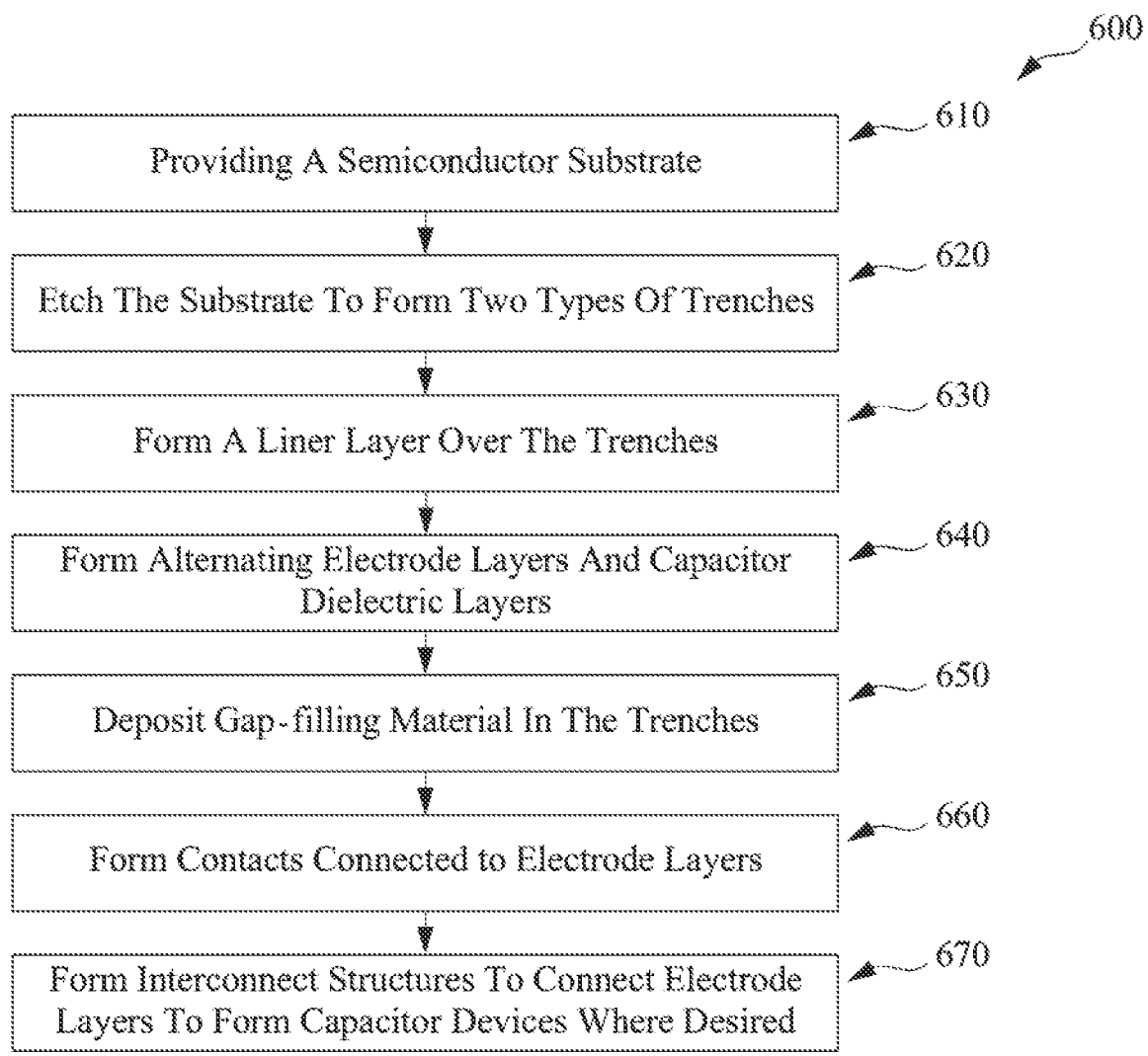
FIG. 6 is a simplified flow chart illustrating a method for forming a semiconductor die, in accordance with some embodiments.

FIG. 6 is a simplified flow chart illustrating a method for forming a semiconductor die, in accordance with some embodiments. FIGS. 7A-7G are simplified cross-sectional views illustrating a method for forming a semiconductor die, in accordance with some embodiments. The method is described with reference to the flowchart in FIG. 6 and the cross-sectional views in FIGS. 7A-7G.

As summarized in the flowchart in FIG. 6, the method 600 for forming a semiconductor die includes the following processes.

- 610: Provide a semiconductor substrate.
- 620: Etch the substrate to form two types of trenches,
- 630: Form a liner layer overlying a bottom region and sidewalls of the first and second trench segments.
- 640: form alternating electrode layers and capacitor dielectric layers overlying the liner layer.
- 650: Deposit a gap-filling dielectric material filling a space in the trench segments not filled by the alternating electrode layers and capacitor dielectric layers and leaving an air gap in the trench segment, wherein the air gap in the first trench segment is characterized by a first gap width and the air gap in the second trench segment is characterized by a second gap width that is greater than the first gap width.
- 660: Form contacts to each of the electrode layers in the first trench segments; and
- 670: Form interconnect structures to connect the electrode layers in the first trench segments to first and second capacitor electrodes, while leaving the electrode layers in the second trench segments unconnected.

Each of the processes of method 600 is described below with reference to the cross-sectional views illustrated in FIGS. 7A-7G.

At 610, the method includes providing a semiconductor substrate. As illustrated in FIG. 7A, substrate 301 is a semiconductor substrate, such as Si, Ge, etc., or other suitable semiconductor substrate.

At 620, the method includes etch the substrate to form two types of trenches, including:
- a plurality of first trench segments characterized by a first trench length, a first trench width, and a first trench spacing; and
- a plurality of second trench segments characterized by a second trench length, a second trench width, and a second trench spacing;
- wherein the second trench width is greater than the first trench width, and the second trench spacing is less than the first trench spacing.

Figure 7B:
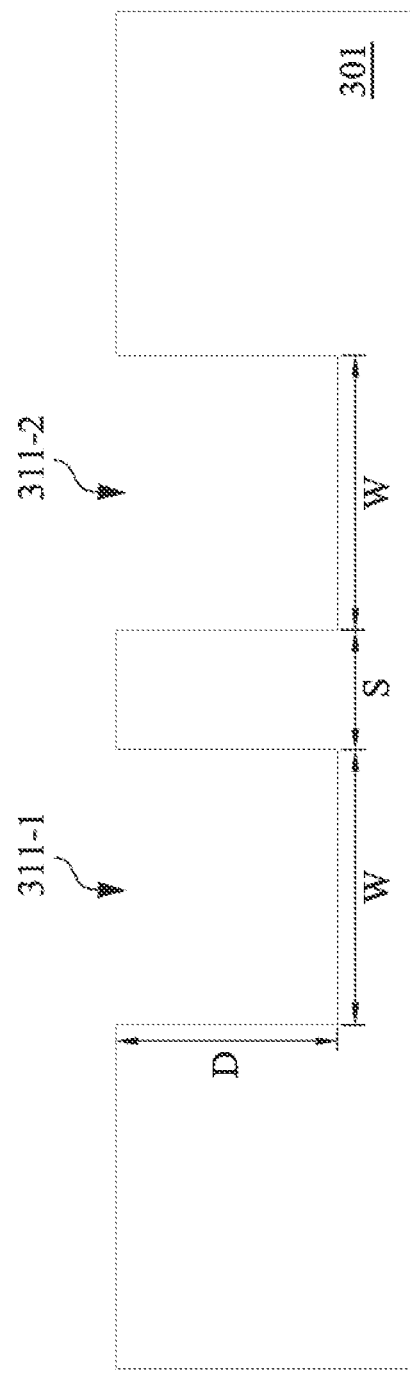

As illustrated in FIG. 7B, trenches 311-1 and 311-2 are etched in substrate 301. In some embodiments, etching a substrate to form trenches comprises forming an etching mask that includes trench patterns for the plurality of first trench segments and the plurality of second trench segments; and etching the substrate through the etching mask.

Figure 7C:
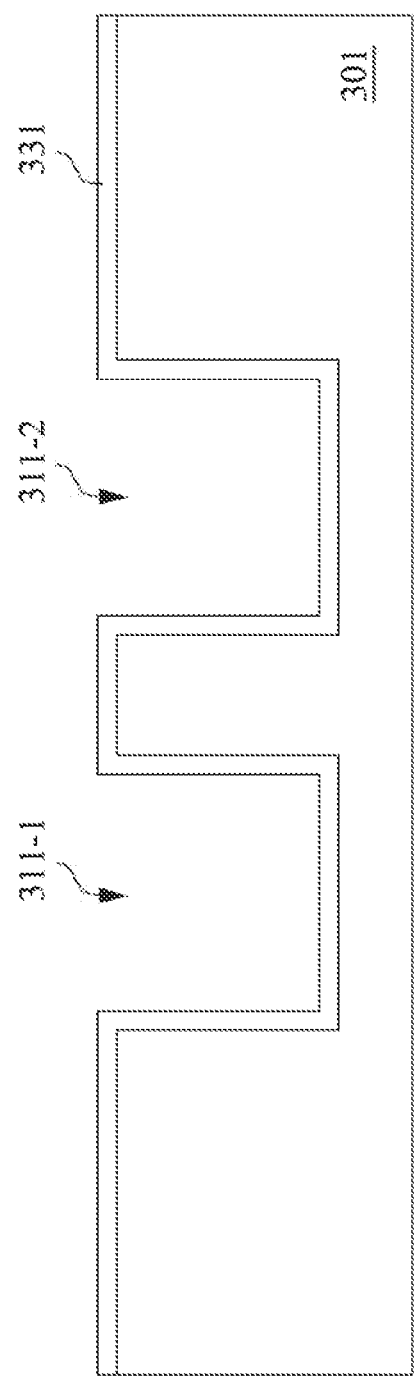

At 630, the method 600 includes forming a liner layer overlying a bottom region and sidewalls of the first and second trench segments. As illustrated in FIG. 7C, a liner layer 331 is formed overlying trenches 311-1 and 311-2.

Figure 7D:
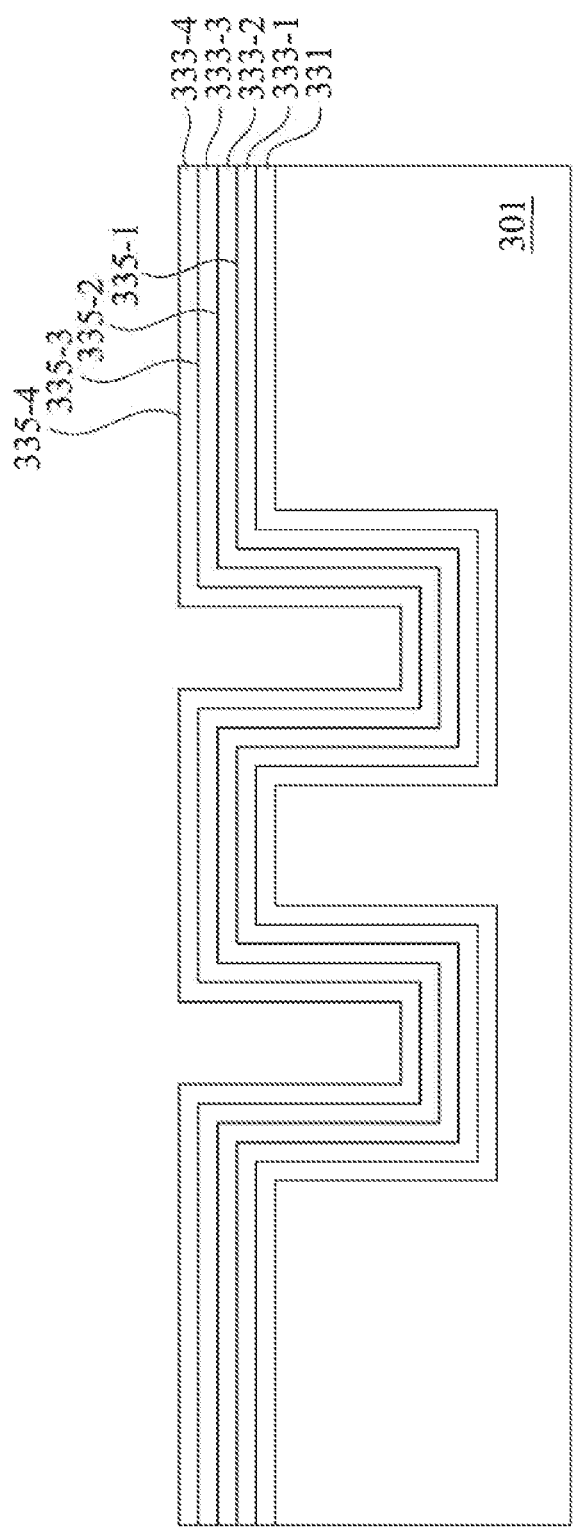

At 640, the method includes forming alternating electrode layers and capacitor dielectric layers overlying the liner layer, as shown in FIG. 7D. Here, the method includes:

forming a first electrode layer on the liner layer;
forming a first capacitor dielectric layer on the first electrode layer;
forming a second electrode layer on the first capacitor dielectric layer;
. . .
forming an Ith first capacitor dielectric layer on the Ith electrode layer;
forming an (I+1)th electrode layer on the Ith first capacitor dielectric layer, wherein I=2 to N, and N is an integer equal to or greater than 2.

In some embodiments, the electrode layers comprise TiN layers, and the capacitor dielectric layers comprises high-K dielectric materials.

At 650, the method includes depositing a gap-filling dielectric material filling a space in the trench segments not filled by the alternating electrode layers and capacitor dielectric layers and leaving an air gap in the trench segment, wherein the air gap in the first trench segment is characterized by a first gap width and the air gap in the second trench segment is characterized by a second gap width that is greater than the first gap width.

In some embodiments, depositing a gap-filling dielectric material comprises depositing a dielectric material characterized by a dielectric constant between 0.9 and 2.6.

Figure 7E:
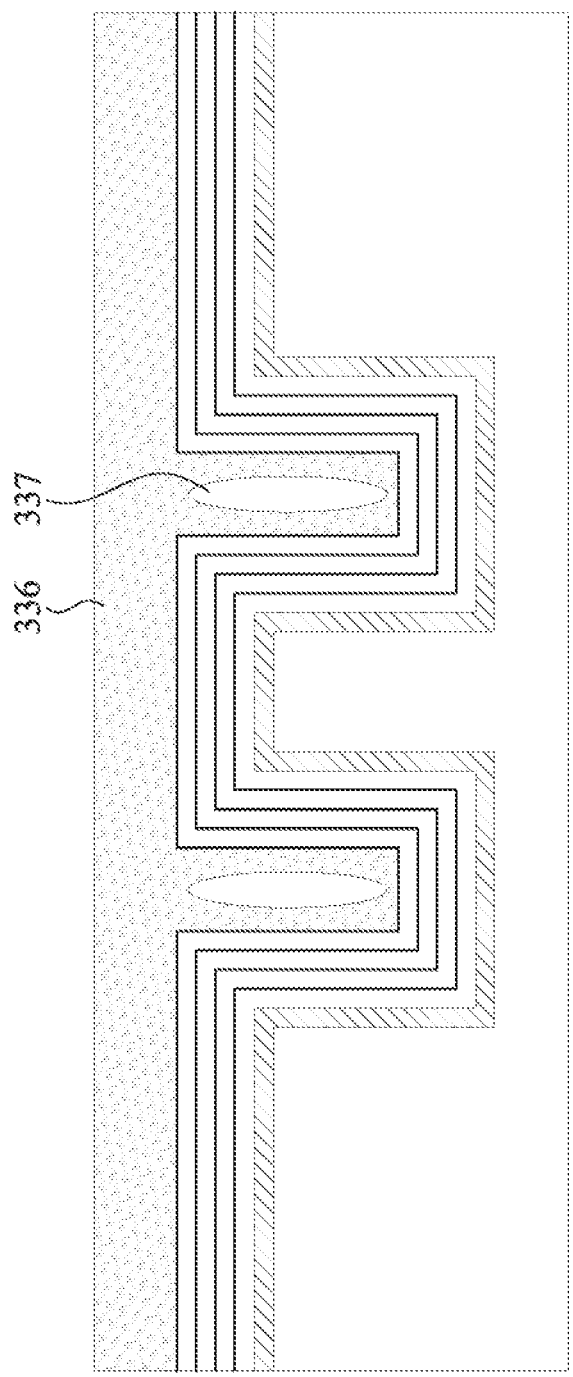

FIG. 7E illustrates a gap-filling material 336 is deposited over the trenches, and forms air gaps 337 in the trenches.

Figure 7F:
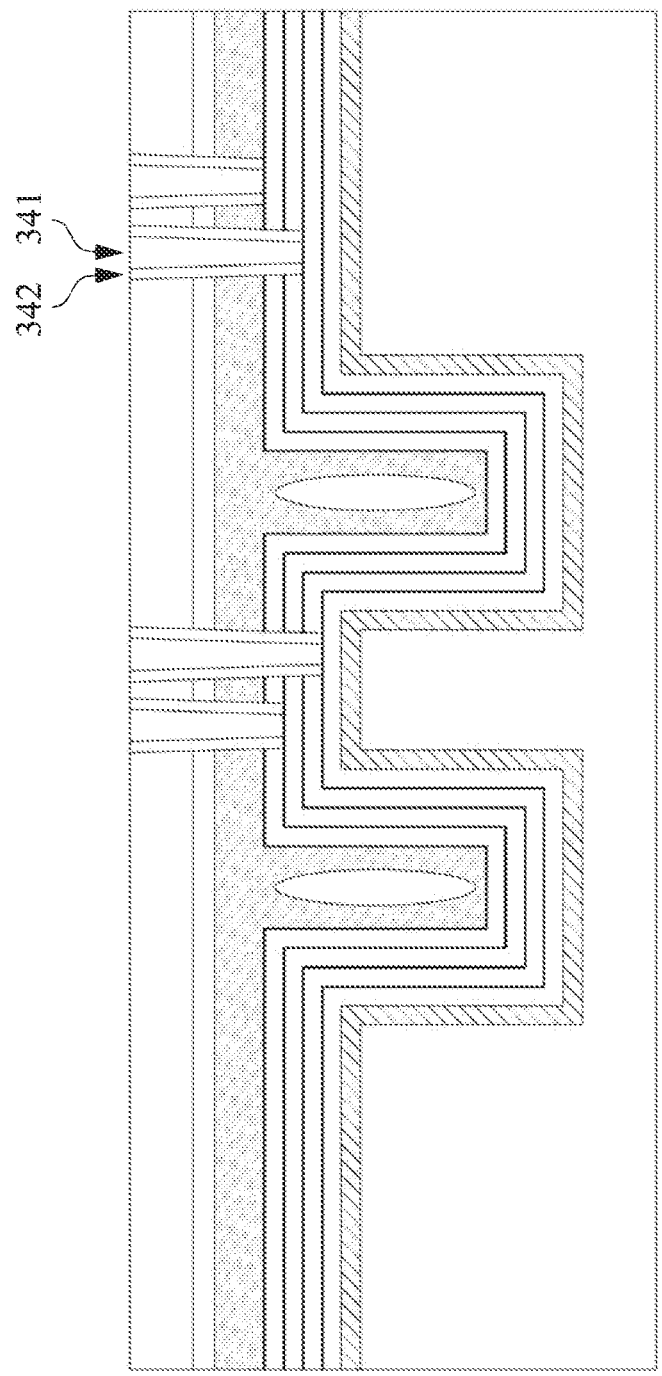

At 660, the method 600 includes forming contacts connected to each of the electrode layers in the first trench segments. FIG. 7F illustrates contact holes 341 and liner metal 342 formed in the contact holes 341.

Figure 7G:
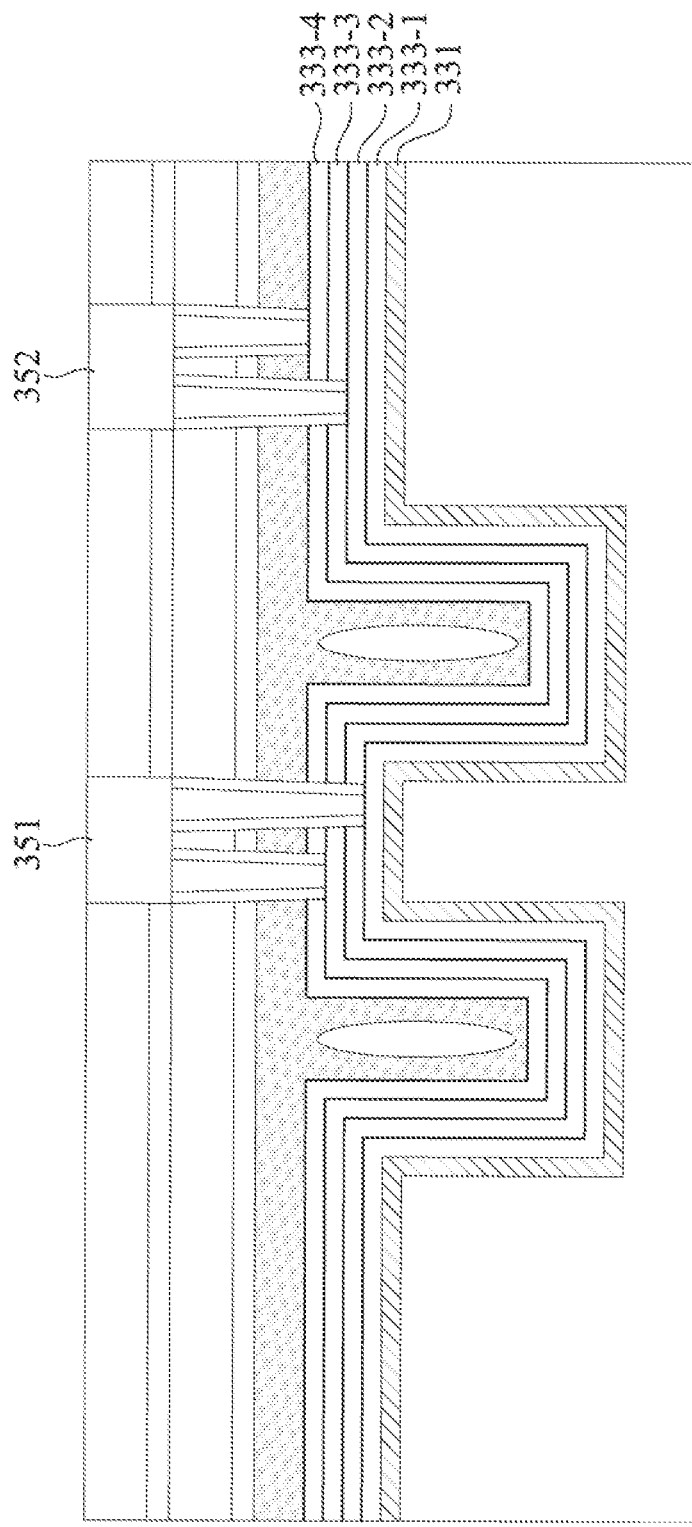

At 670, the method includes forming interconnect structures to connect the electrode layers in the first trench segments to first and second capacitor electrodes, while leaving the electrode layers in the second trench segments unconnected. FIG. 7G shows that interconnect structures are made to form capacitor electrodes 351 and 352 to connect the electrode layers. For example, capacitor electrode 351 is connected to electrode layers 333-1 and 333-3. Similarly, capacitor electrode 352 is connected to electrode layers 333-2 and 333-4.

In some embodiments, the method 600 can also includes forming hybrid bonding layers coupled to the interconnect structures at a front side of the semiconductor die, and forming TSVs in the substrate for bonding at a back side of the semiconductor die. An example is shown in FIG. 1.

The present disclosure thus provides various novel trench designs and layouts for high density trench capacitors that yield less warpage associated with the die and wafer. The inventors have observed that in a semiconductor die of deep trenches, a substantially uniform alignment of the capacitor arrays can increases stress between the capacitor structures. The stresses increase a likelihood of warpage and/or fracturing of the IC die as well as the wafer. Furthermore, as the capacitor structures are fully-filled with the conductive layers and dielectric layers, the stress is likely to increase. Therefore, in accordance with some embodiments, at least two different capacitor cell structures are intermingled to avoid uniform cell layouts. For example, a semiconductor die includes an array of first capacitor regions, each of the first capacitor regions including multiple first capacitor cell structures, wherein each first capacitor cell structure includes a plurality of first trench segments characterized by a first trench length, a first trench width, and a first trench spacing, and a first air gap width in a gap-filling material. The semiconductor die also includes a plurality of second capacitor regions interspersed in the array of first capacitor regions, each of the second capacitor region including multiple second capacitor cell structures, wherein each second capacitor cell structures includes a plurality of second trench segments characterized by a second trench length, a second trench width, a second trench spacing, and a second air gap width in the gap-filling material. Each first capacitor region is configured to provide a capacitance between a first capacitor electrode and a second capacitor electrode connected to respective alternating electrode layers in the first capacitor cell structures. Each second capacitor region is configured to provide structural variation with different trench width, trench spacing, and air gap width from the first capacitor region, without capacitor electrodes for providing a capacitance.

In accordance with some embodiments, a semiconductor die includes first capacitor cell structures defined in a substrate, wherein each first capacitor cell structure comprises a plurality of first trench segments having a predetermined first length extending along a surface of the substrate, the plurality of first trench segments characterized by a first trench width and a first spacing between adjacent first trench segments. A given first trench segment includes a stack of alternating electrode layers and capacitor dielectric layers overlying a bottom region and sidewalls of the given first trench segment; and a gap-filling dielectric material filling a space in the given first trench segment not filled by the stack of alternating electrode layers and capacitor dielectric layers and leaving an air gap of a first gap width in the given first trench segment. The semiconductor die also includes second capacitor cell structures defined in the substrate, wherein each second capacitor cell structures comprises a plurality of second trench segments having a predetermined second length extending along the surface of the substrate, the plurality of second trench segments characterized by a second trench width and a second trench spacing between adjacent second trench segments A given second trench segment includes a stack of alternating electrode layers and capacitor dielectric layers overlying a bottom region and sidewalls of the given second trench segments; and a gap-filling dielectric material filling a space in the given second trench segment not filled by the stack of alternating electrode layers and capacitor dielectric layers and leaving an air gap of a second gap width in the given second trench segment. In some embodiments, the second trench width is greater than the first trench width by 10% or more, the second trench spacing is less than the first trench spacing by 20% or more, and the second air gap width is greater than the first air gap width by 20% or more. he semiconductor die includes an array of first capacitor regions, each of the first capacitor regions including multiple first capacitor cell structures; and a plurality of second capacitor regions interspersed in the array of first capacitor regions, each of the second capacitor regions including multiple second capacitor cell structures. Each first capacitor region is configured to provide a capacitance between a first capacitor electrode and a second capacitor electrode connected to respective alternating electrode layers in the first capacitor cell structures. Each second capacitor region is configured to provide structural variation with different trench width, trench spacing, and air gap width from the first capacitor region, without capacitor electrodes for providing a capacitance.

In accordance with some embodiments, a semiconductor die includes an array of first capacitor regions, each of the first capacitor regions including multiple first capacitor cell structures, wherein each first capacitor cell structure includes a plurality of first trench segments characterized by a first trench length, a first trench width, and a first trench spacing, and a first air gap width in a gap-filling material. The semiconductor die also includes a plurality of second capacitor regions interspersed in the array of first capacitor regions, each of the second capacitor region including multiple second capacitor cell structures, wherein each second capacitor cell structures includes a plurality of second trench segments characterized by a second trench length, a second trench width, a second trench spacing, and a second air gap width in the gap-filling material. The second trench width is greater than the first trench width, the second trench spacing is less than the first trench spacing, and the second air gap width is greater than the first air gap width.

In accordance with some embodiments, a method for forming a semiconductor die includes etching a substrate to form trenches. In some embodiments, the etching results in a plurality of first trench segments characterized by a first trench length, a first trench width, and a first trench spacing, and a plurality of second trench segments characterized by a second trench length, a second trench width, and a second trench spacing. The second trench width is greater than the first trench width, and the second trench spacing is less than the first trench spacing. The method includes forming a liner layer overlying a bottom region and sidewalls of the first and second trench segments. The method also includes forming alternating electrode layers and capacitor dielectric layers overlying the liner layer. Further, a gap-filling dielectric material is deposited to fill a space in the trench segments not filled by the alternating electrode layers and capacitor dielectric layers and leaving an air gap in the trench segment, wherein the air gap in the first trench segment is characterized by a first gap width and the air gap in the second trench segment is characterized by a second gap width that is greater than the first gap width. The method also includes forming contacts connected to each of the electrode layers in the first trench segments, and forming interconnect structures to connect the electrode layers in the first trench segments to first and second capacitor electrodes, while leaving the electrode layers in the second trench segments unconnected.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor die, comprising:
first capacitor cell structures defined in a substrate, wherein each first capacitor cell structure comprises a plurality of first trench segments having a predetermined first length extending along a surface of the substrate, the plurality of first trench segments characterized by a first trench width and a first spacing between adjacent first trench segments, wherein a given first trench segment includes:
a stack of alternating electrode layers and capacitor dielectric layers overlying a bottom region and sidewalls of the given first trench segment; and
a gap-filling dielectric material filling a space in the given first trench segment not filled by the stack of alternating electrode layers and capacitor dielectric layers and leaving an air gap of a first gap width in the given first trench segment;
second capacitor cell structures defined in the substrate, wherein each second capacitor cell structures comprises a plurality of second trench segments having a predetermined second length extending along the surface of the substrate, the plurality of second trench segments characterized by a second trench width and a second trench spacing between adjacent second trench segments, wherein a given second trench segment includes:
a stack of alternating electrode layers and capacitor dielectric layers overlying a bottom region and sidewalls of the given second trench segments; and
a gap-filling dielectric material filling a space in the given second trench segment not filled by the stack of alternating electrode layers and capacitor dielectric layers and leaving an air gap of a second gap width in the given second trench segment;
wherein:
the second trench width is greater than the first trench width by 10% or more;
the second trench spacing is less than the first trench spacing by 20% or more; and
the second air gap width is greater than the first air gap width by 20% or more;
wherein the semiconductor die comprises:
an array of first capacitor regions, each of the first capacitor regions including multiple first capacitor cell structures; and
a plurality of second capacitor regions interspersed in the array of first capacitor regions, each of the second capacitor regions including multiple second capacitor cell structures;
wherein:
each first capacitor region is configured to provide a capacitance between a first capacitor electrode and a second capacitor electrode connected to respective alternating electrode layers in the first capacitor cell structures; and
each second capacitor region provides no capacitor electrodes, and each second capacitor region is configured to provide structural variation with different trench width, trench spacing, and air gap width from the first capacitor region.

2. The semiconductor die of claim 1, wherein a given first capacitor cell structure comprises an array of first trench segments extending in a predetermined direction.

3. The semiconductor die of claim 2, wherein a given first capacitor region comprises:
a first array of first trench segments extending in a first direction;
a second array of first trench segments extending in a second direction different than the first direction; and
a third array of first trench segments extending in the first direction.

4. The semiconductor die of claim 1, wherein:
the first trench width is in a range of 0.3 μm to 0.40 μm; and
the second trench width is in a range of 0.25 μm to 0.35 μm.

5. The semiconductor die of claim 1, wherein:
the first trench spacing is in a range of 0.1 μm to 0.20 μm, and
the second trench spacing is in a range of 0.05 μm to 0.15 μm.

6. The semiconductor die of claim 1, wherein in a given first capacitor region comprises a two-dimensional array of first capacitor cell structures, wherein each first capacitor cell structure is oriented perpendicular to its immediate neighbors in the two-dimensional array.

7. The semiconductor die of claim 1, wherein:
the electrode layers comprise TiN layers; and
the capacitor dielectric layers comprises high-K dielectric materials.

8. The semiconductor die of claim 1, wherein one of the first capacitor regions comprises second capacitor cell structures.

9. A semiconductor die, comprising:
an array of first capacitor regions, each of the first capacitor regions including multiple first capacitor cell structures, wherein each first capacitor cell structure includes a plurality of first trench segments characterized by a first trench length, a first trench width, and a first trench spacing, and a first air gap width in a gap-filling material;
a plurality of second capacitor regions interspersed in the array of first capacitor regions, each of the second capacitor region including multiple second capacitor cell structures, wherein each second capacitor cell structures includes a plurality of second trench segments characterized by a second trench length, a second trench width, a second trench spacing, and a second air gap width in the gap-filling material;
wherein:
the second trench width is greater than the first trench width;
the second trench spacing is less than the first trench spacing; and
the second air gap width is greater than the first air gap width.

10. The semiconductor die of claim 9, further comprising a stack of alternating electrode layers and capacitor dielectric layers overlying the first and second trench segments.

11. The semiconductor die of claim 10, wherein:
each first capacitor region is configured to provide a capacitance between a first capacitor electrode and a second capacitor electrode connected to respective alternating electrode layers in the first capacitor cell structures; and
each second capacitor region is configured to provide structural variation with different trench width, trench spacing, and air gap width from the first capacitor region, without capacitor electrodes for providing a capacitance.

12. The semiconductor die of claim 10, wherein:
the electrode layers comprise TiN layers; and
the capacitor dielectric layers comprises high-K dielectric materials.

13. The semiconductor die of claim 9, wherein:
the first trench spacing is in a range of 0.1 μm to 0.20 μm; and
the second trench spacing is in a range of 0.05 μm to 0.15 μm.

14. The semiconductor die of claim 9, wherein:
the first trench width is in a range of 0.3 μm to 0.40 μm; and
the second trench width is in a range of 0.25 μm to 0.35 μm.

15. A method for forming a semiconductor die, comprising:
etching a substrate to form trenches, including:
a plurality of first trench segments characterized by a first trench length, a first trench width, and a first trench spacing; and
a plurality of second trench segments characterized by a second trench length, a second trench width, and a second trench spacing;
wherein the second trench width is greater than the first trench width, and the second trench spacing is less than the first trench spacing;
forming a liner layer overlying a bottom region and sidewalls of the first and second trench segments;
forming alternating electrode layers and capacitor dielectric layers overlying the liner layer;
depositing a gap-filling dielectric material filling a space in the trench segments not filled by the alternating electrode layers and capacitor dielectric layers and leaving an air gap in the trench segment, wherein the air gap in the first trench segment is characterized by a first gap width and the air gap in the second trench segment is characterized by a second gap width that is greater than the first gap width;
forming contacts connected to each of the electrode layers in the first trench segments; and
forming interconnect structures to connect the electrode layers in the first trench segments to first and second capacitor electrodes, while leaving the electrode layers in the second trench segments unconnected.

16. The method of claim 15, wherein etching a substrate to form trenches comprises forming an etching mask that includes trench patterns for the plurality of first trench segments and the plurality of second trench segments; and etching the substrate through the etching mask.

17. The method of claim 15, wherein forming alternating electrode layers and capacitor dielectric layers comprises:
forming a first electrode layer on the liner layer;
forming a first capacitor dielectric layer on the first electrode layer;
forming a second electrode layer on the first capacitor dielectric layer;
forming an Ith first capacitor dielectric layer on the Ith electrode layer;
forming an (I+1)th electrode layer on the Ith first capacitor dielectric layer,
wherein I=2 to N, I is an integer and N is an integer equal to or greater than 2.

18. The method of claim 15, wherein:
the electrode layers comprise TiN layers; and
the capacitor dielectric layers comprises high-K dielectric materials.

19. The method of claim 15, wherein depositing a gap-filling dielectric material comprises depositing a dielectric material characterized by a dielectric constant between 0.9 and 2.6.

20. The method of claim 15, further comprising:
forming hybrid bonding layers coupled to the interconnect structures at a front side of the semiconductor die; and forming TSVs in the substrate for bonding at a back side of the semiconductor die.

* * * * *